(12) United States Patent
Liang

(10) Patent No.: US 7,050,512 B1
(45) Date of Patent: *May 23, 2006

(54) RECEIVER ARCHITECTURE

(75) Inventor: Guojin Liang, Milpitas, CA (US)

(73) Assignee: Pixelworks, Inc., Tualatin, OR (US)

( * ) Notice: Subject to any disclaimer, the term of this patent is extended or adjusted under 35 U.S.C. 154(b) by 866 days.

This patent is subject to a terminal disclaimer.

(21) Appl. No.: 09/757,348

(22) Filed: Jan. 8, 2001

(51) Int. Cl.
*H04L 27/22* (2006.01)
*H04L 7/00* (2006.01)
*G06F 1/12* (2006.01)

(52) U.S. Cl. .................. 375/316; 375/356; 713/401
(58) Field of Classification Search ............... 375/316, 375/257, 356, 371; 327/152, 237; 713/401, 713/503
See application file for complete search history.

(56) References Cited

U.S. PATENT DOCUMENTS

| | | | | |
|---|---|---|---|---|
| 4,965,884 A | * | 10/1990 | Okura et al. | 375/354 |
| 5,298,866 A | * | 3/1994 | Kaplinsky | 327/261 |
| 5,313,501 A | * | 5/1994 | Thacker | 375/369 |
| 5,621,774 A | * | 4/1997 | Ishibashi et al. | 375/371 |
| 5,623,644 A | * | 4/1997 | Self et al. | 713/503 |
| 5,734,685 A | * | 3/1998 | Bedell et al. | 375/356 |
| 5,740,210 A | * | 4/1998 | Rokugawa | 375/362 |
| 5,794,020 A | * | 8/1998 | Tanaka et al. | 713/401 |
| 5,867,541 A | * | 2/1999 | Tanaka et al. | 375/354 |
| 6,031,847 A | * | 2/2000 | Collins et al. | 370/508 |
| 6,173,432 B1 | * | 1/2001 | Harrison | 716/1 |
| 6,336,192 B1 | * | 1/2002 | Sakamoto et al. | 713/503 |
| 6,370,200 B1 | * | 4/2002 | Takahashi | 375/257 |
| 6,434,081 B1 | * | 8/2002 | Johnson et al. | 365/233 |
| 6,484,268 B1 | * | 11/2002 | Tamura et al. | 713/600 |
| 6,542,552 B1 | * | 4/2003 | Yoshikawa et al. | 375/257 |
| 6,629,250 B1 | * | 9/2003 | Kopser et al. | 713/401 |
| 6,680,636 B1 | * | 1/2004 | Parry et al. | 327/161 |

* cited by examiner

*Primary Examiner*—Emmanuel Bayard
*Assistant Examiner*—Lawrence B. Williams
(74) *Attorney, Agent, or Firm*—Marger Johnson & McCollom, PC

(57) ABSTRACT

An improved receiver architecture is disclosed comprising a latching mechanism coupled to receive a data stream, and a signal generator for generating latching control signals for controlling the operation of the latching mechanism. The signal generator generates one latching control signal per data period of the data stream, with each latching control signal coinciding approximately with the midpoint of a corresponding data period. The signal generator generates the latching control signals based upon a reference signal, which in one embodiment, coincides approximately with the midpoint of a data period of the data stream. The receiver may further comprise an adjustable delay element and a delay adjustment control. The adjustable delay element receives a clock signal and imposes a variable delay thereon to derive the reference signal used to generate the latching control signals. The magnitude of the variable delay is controlled by the delay adjustment control. In one embodiment, the variable delay is set such that the reference signal is made to coincide approximately with the midpoint of a data period of the data stream. With the ability to adjust the variable delay, the receiver is able to derive a proper reference signal regardless of the alignment of the data stream.

34 Claims, 9 Drawing Sheets

RECEIVER ARCHITECTURE

FIELD OF THE INVENTION

This invention relates generally to information transfer systems, and more particularly to an improved receiver architecture for processing information from a data stream.

BACKGROUND

In the information transfer systems of today, speed is a major if not the primary consideration. The faster information can be transferred from one location to another, the better. Because of the need for increased speed performance, a number of techniques have been developed to facilitate and to accelerate data transfer.

Typically, information is transferred from a starting location to a destination by first converting the information from a parallel format to a serialized format. Then, the serialized information is transmitted as a data stream across a transmission medium such a coaxial cable, a twisted pair cable, or a fiber optic cable, to the destination. At the destination, a receiver receives the data stream, and processes it to convert the information back into a parallel format. Thereafter, the parallel information is used for its intended purpose. As a general rule, transferring serialized information is slower than transferring parallel information. This is because rather than sending multiple data units at a time, serialized information is sent one data unit at a time. Because of this, sending serialized information can take substantially longer than sending parallel information. As a result, whenever possible, it is preferable to send information in a parallel rather than a serialized fashion.

To enable multiple data units to be transferred across a transmission medium in parallel, multiple transmission lines may be bundled together to form a multi-link channel. An example of such a setup is shown in FIG. 1, wherein a plurality of transmission lines 106 are bundled and used to connect a multi-link transmitter 102 with a multi-link receiver 104. On each transmission line 106, there is sent a separate data stream, and for each data stream, there is a plurality of serialized data units with each data unit occupying a data period. Because there are multiple transmission lines 106, and because a data unit is sent on each line during each data period, multiple data units are received by the multi-link receiver 104 during each data period. Thus, even though each of the transmission lines 106 carries a serialized data stream, because of the presence of the multiple transmission lines 106, the multi-link receiver 104 is able to receive multiple data units per data period (i.e. receives data units in parallel). By using multiple transmission lines in this manner, it is possible to transfer information from a starting location to a destination much more quickly.

The multi-channel implementation of FIG. 1 does not come without its problems, however. One of its major problems is the phenomenon known as inter-pair skew. With inter-pair skew, data streams arrive at the multi-link receiver 104 out of alignment. This is so even when the data streams leave the multi-link transmitter 102 completely aligned with each other. Inter-pair skew may be caused by a number of different factors, such as differences in characteristics between the various transmission lines 106, different distances traveled on each transmission line 106, as well as other factors. The inter-pair skew phenomenon is illustrated in the timing diagram of FIG. 2 for the system shown in FIG. 1. Specifically, dt(1) and dt(n) represent two data streams as they leave the transmitter 102 on transmission lines 106(1) and 106(n), respectively, while dr(1) and dr(n) represent the data streams as they arrive at the receiver 104. Notice that the data transition edges of dt(1) and dt(n) are aligned with each other, but the transition edges of dr(1) and dr(n) are not. This shows that while the data streams were aligned with each other at the time they exited the transmitter 102, they are not aligned when they arrive at the receiver 104. This misalignment makes it difficult for the receiver 104 to recover data from both data streams dr(1), dr(n).

To elaborate, a receiver typically recovers data from a data stream by generating a clock signal that is both synchronized and aligned with the data stream. Then, the clock signal is used to generate latching control signals, which are used to latch or sample each of the data units in the data stream. It is usually desirable to generate each latching control signal such that it falls near the middle of a data period so that each data unit is sampled during a time at which its data value is most stable. Since the timing of the latching control signals relative to the data periods of the data stream is important, and since the latching control signals are generated based upon the clock signal, it follows that the alignment of the clock signal relative to the data periods of the data stream is also important. When multiple data streams arrive at a receiver out of alignment, it is impossible for a single clock signal to maintain proper alignment with all of the data streams. As a result, a typical multi-link receiver 104 cannot use the same clock signal to recover data from all data streams dr(1)–dr(n). In general, inter-pair skew makes recovering data from multiple data streams significantly more difficult and complex.

One possible solution to the inter-pair skew problem is to oversample each data stream. That is, during each data period, instead of generating just one latching control signal, multiple latching control signals are generated. These latching control signals are then applied to each data stream to latch in the data units of that data stream. Typically, oversampling is implemented using three, four, or more latching control signals per data period, with each latching control signal being separated from another latching control signal by a certain time constant. By sampling each data unit at multiple points in time, it is likely that at least one of the samples will be taken near the midpoint of the data period where the data unit is stable. By using the data value from that sample, the value of the data unit can be ascertained. Notice that with oversampling, it is not necessary to generate a clock signal that is synchronized and aligned with each data stream. By removing the requirement for a synchronized and aligned clock signal, oversampling solves the inter-pair skew problem. With oversampling, the same set of latching control signals can be applied to all of the incoming data streams.

With reference to FIG. 3, there is shown a timing diagram for a typical implementation of oversampling. Specifically, FIG. 3 depicts two incoming data streams dr(1) and dr(n) which are out of alignment with each other. In addition, FIG. 3 shows four latching control signals C1, C2, C3, and C4, all of which trigger within the span of one data period. For the sake of simplicity, only four control signals C1–C4 are shown; however, it should be understood that there are four control signals per data period. The control signals C1–C4 within a data period are separated from each other by a time constant TC. Depending upon the relative alignment between each data stream dr(1), dr(n) and the control signals C1–C4, one of the controls signals C1–C4 will be used as the preferred signal for extracting data from the data stream. For example, it appears from FIG. 3 that latching control signal C2 falls closest to the midpoint of the data periods for data stream dr(1); thus, signal C2 will be the preferred signal for extracting information from data stream dr(1). In contrast, for data stream dr(n), it appears that control signal C3 falls closest to the midpoint of the data periods. Consequently, signal C3 will be the preferred signal for extracting data from data stream dr(n). By generating multiple latching control signals per data period, it is possible to use the same set of latching control signals to extract data from multiple data streams, even when those data streams are misaligned relative to each other.

Oversampling provides a solution to the inter-pair skew problem. However, this solution does not come without significant drawbacks. For one thing, generating and managing multiple latching control signals per data period imposes significant additional overhead, both in terms of generating additional signals and of providing additional storage (since each sampled value needs to be stored). As a result, there is significant redundancy in an oversampling system. Also, notice that the sampling position is not optimal. Rather than sampling a data unit at the midpoint of a data period, oversampling samples the data unit at positions which are just somewhat close to the midpoint. This may lead to data errors. In addition and perhaps most significantly, oversampling imposes a practical limit on how quickly data can be transmitted. By requiring a small delay (time constant TC) between successive latching control signals, oversampling limits the rate at which data can be practically sent in a data stream.

To elaborate, a delay is typically imposed on a signal by passing the signal through a delay element. The delay provided by the delay element depends upon how quickly the element processes the signal. As a general rule, the faster an element processes a signal (and hence, the shorter the delay), the more difficult and expensive the element is to manufacture. Due to constraints such as cost and technological limitations, there is a practical limit on how quickly a delay element can process a signal, and hence, how small a delay can be. For purposes of discussion, this limit will be referred to as TCmin and it will be assumed that the time constant TC (FIG. 3) between the control signals C1–C4 is set to TCmin. As noted above, there are typically four latching control signals per data period in an oversampling implementation; hence, there are four TCmin's per data period. Since TCmin is a minimum, this means that the shortest data period that a data unit can have is four times TCmin. Since frequency is the inverse of period, this in turn means that the highest frequency that a data stream can have is 1/4TCmin. Since data rate is directly proportional to frequency, it follows that data rate is also limited by the factor 1/4TCmin. As this discussion shows, TCmin plays a large role in limiting the rate at which data can be sent in a data stream. Depending upon the magnitude of TCmin, the maximum achievable data rate may be much lower than would be desired. This aspect of oversampling makes it an unattractive solution in many implementations.

As an alternative to oversampling, a plurality of phase locked loops (PLL) may be used to recover data from the multiple data streams. According to this implementation, an individual PLL is coupled to receive each of the data streams. Each PLL generates a clock signal that is synchronized and aligned with the data stream that it receives. Then, based upon that clock signal, the PLL generates a plurality of latching control signals, one for each data period of the data stream. Each latching control signal falls around the midpoint of each data period. Once generated, the latching control signals are used to latch each of the data units of the data stream. In a PLL implementation, each PLL works independently to recover data from the data stream with which it is associated. Because data from each data stream is recovered independently, misalignment among the various data streams has no affect on the operation of the system. Thus, even in the face of inter-pair skew, a PLL implementation is able to recover data from multiple data streams.

While the PLL implementation provides a possible solution to the inter-pair skew problem, it comes with some significant drawbacks. First, because it uses PLL's, jitter performance is less than optimal, and power consumption is relatively high due to the nature of PLUs. In addition and more significantly, the PLL implementation, like oversampling, can significantly limit the rate at which data can be transferred in a data stream. To illustrate this problem, reference will be made to FIG. 4, wherein a timing diagram for one of the PLL's in a typical PLL implementation is shown. For the sake of simplicity, only one latching control signal C1 is depicted in FIG. 4; however, it should be understood that there is a latching control signal for each data period.

As shown in FIG. 4, the control signal C1 is generated by delaying the Clock signal by a time constant TC, which is one half of a data period. Since TC is one half of a data period in duration, it follows that there are two TC's per data period. Assuming that TC is set to the minimum practical value TCmin as discussed above, it means that the minimum data period that a data stream can have is 2TCmin. Given that frequency is the inverse of period, and that data rate is directly proportional to frequency, if follows that the highest data rate achievable using the PLL implementation is limited by the factor 1/2TCmin. Thus, even though it is not as limiting as the oversampling implementation, the PLL implementation still does impose a significant limit on the rate at which data can be sent in a data stream. Given all of the drawbacks of the current implementations discussed above, there is a need for an improved mechanism for concurrently processing multiple data streams.

SUMMARY

To overcome the shortcomings of the prior art, the present invention provides an improved multi-link receiving mechanism, which solves the inter-pair skew problem but which does not have the undesirable side effects of the prior art. In one embodiment, the multi-link receiving mechanism (MRM) comprises a plurality of receivers. Each receiver receives a separate data stream, and all receivers receive the same clock signal. The data streams may arrive at the MRM out of alignment relative to each other (i.e. may have inter-pair skew), and the clock signal need not be aligned with any of the data streams.

In response to the clock signal and the data stream, each receiver delays the clock signal by a variable delay to derive a reference signal. This is done to achieve a desired relative alignment between the data stream and the reference signal. For example, the clock signal may be delayed such that it causes the reference signal to coincide approximately with the midpoint of one of the data periods of the data stream. Because each receiver receives a separate data stream, and because each data stream may have a different alignment, the initial alignment between the data stream and the clock signal may and probably will differ from receiver to receiver. Thus, the variable delay imposed by each receiver will also most likely differ from receiver to receiver. According to one embodiment, each of the variable delays imposed by the various receivers is greater than or equal to one data period (i.e. none of the variable delays is less than one data period).

Since none of the variable delays is less than one data period, no limits are imposed on the rates at which data in the data streams may be sent, as was the case with the prior art.

Once the reference signal is derived, it is used by the receiver to generate a plurality of latching control signals. In one embodiment, there is one latching control signal per data period, and each latching control signal coincides approximately with the midpoint of a data period. Once generated, the latching control signals are used by the receiver to latch all of the data units of the data stream. Data from the data stream is thus recovered. Each of the receivers operates in the manner described to recover data from each of the data streams. Because each receiver individually adjusts for the varying alignments of the various data streams, the MRM is able to accommodate and properly process data streams with inter-pair skew. Furthermore, the MRM tolerates inter-pair skew without incurring the undesirable side effects of the prior art (e.g. no oversampling, no imposition of limits on maximum data rate, etc.). Consequently, the present invention represents a significant improvement over the prior art.

In addition to the MRM, the present invention further provides an improved receiver architecture, which may be used in either a single receiver or a multi-link implementation. In accordance with one embodiment, the receiver comprises a latching mechanism coupled to receive a data stream, and a signal generator for generating latching control signals for controlling the operation of the latching mechanism. The signal generator, which for example may take the form of a delay locked loop, generates one latching control signal per data period of the data stream, with each latching control signal coinciding approximately with the midpoint of a corresponding data period. In addition, the signal generator generates the latching control signals based upon a reference signal, which in one embodiment, coincides approximately with the midpoint of a data period of the data stream.

In accordance with another embodiment, the receiver further comprises an adjustable delay element and a delay adjustment control. The adjustable delay element receives a clock signal and imposes a variable delay thereon to derive the reference signal used by the signal generator to generate the latching control signals. The magnitude of the variable delay imposed by the adjustable delay element is controlled by the delay adjustment control. In one embodiment, the variable delay is set such that the reference signal is made to coincide approximately with the midpoint of a data period of the data stream. With the ability to adjust the variable delay imposed by the adjustable delay element, the receiver is able to derive a proper reference signal regardless of the alignment of the data stream.

DETAILED DESCRIPTION OF EMBODIMENT(S)

Figure 1:
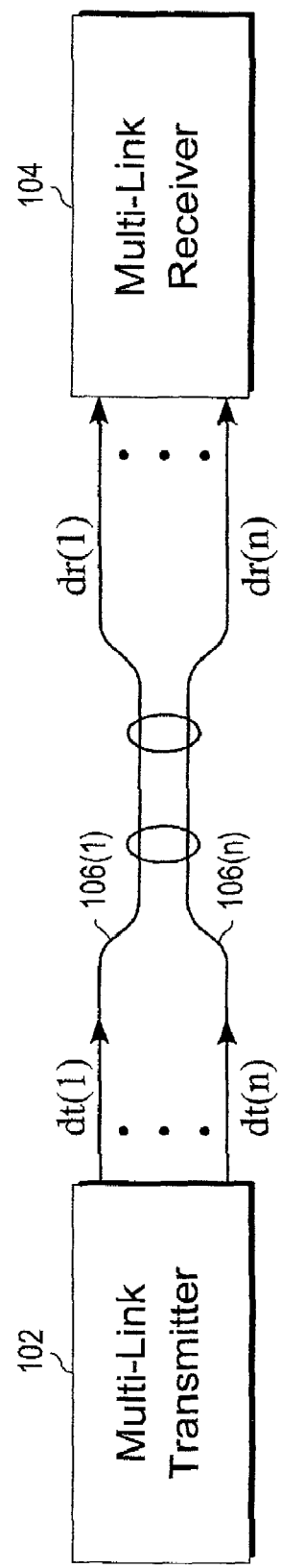
FIG. 1 is a block diagram of a system in which multiple transmission lines are bundled together to form a multi-link channel.
Figure 2:
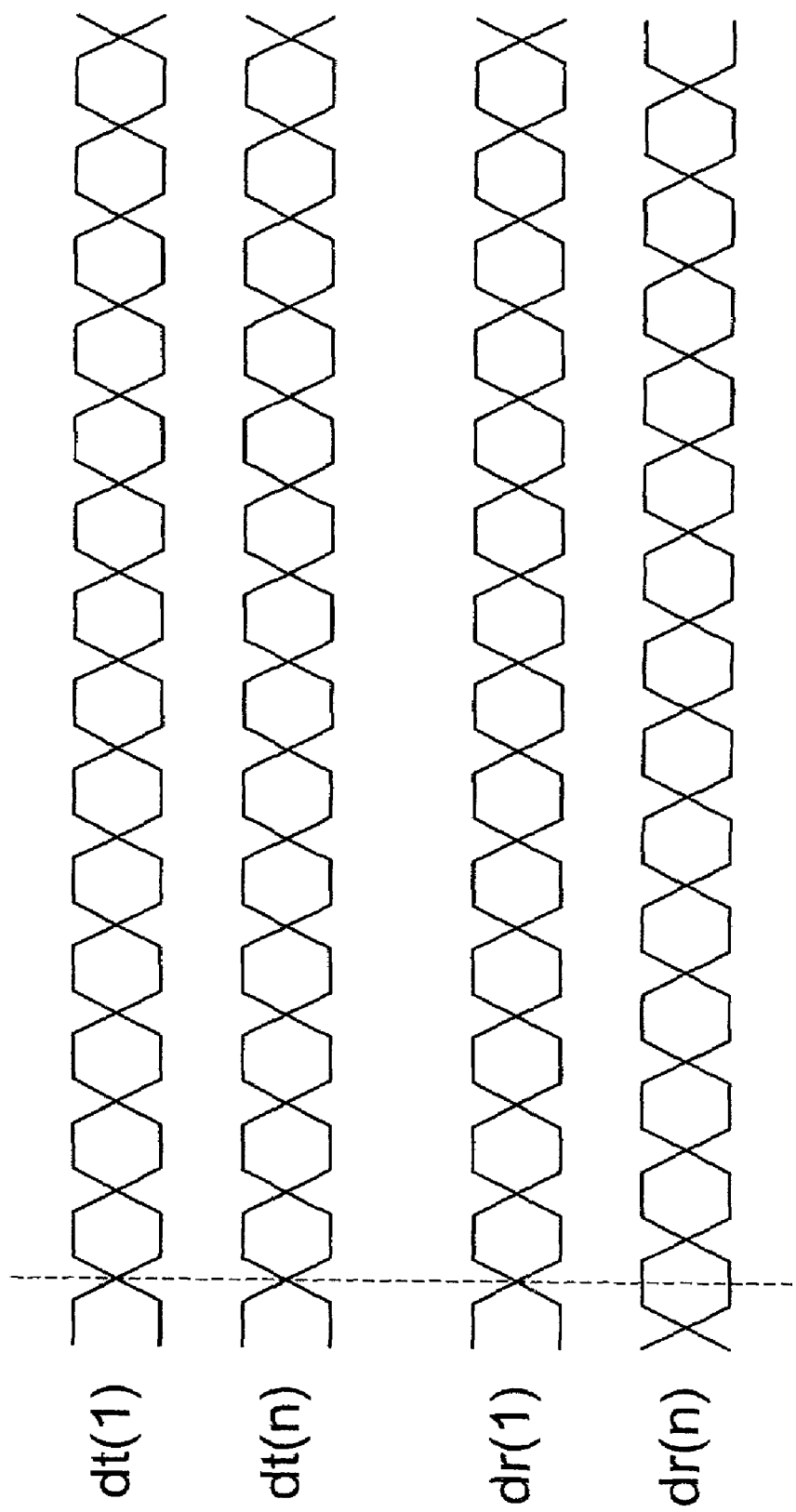
FIG. 2 is a timing diagram illustrating the phenomenon known as inter-pair skew.
Figure 3:
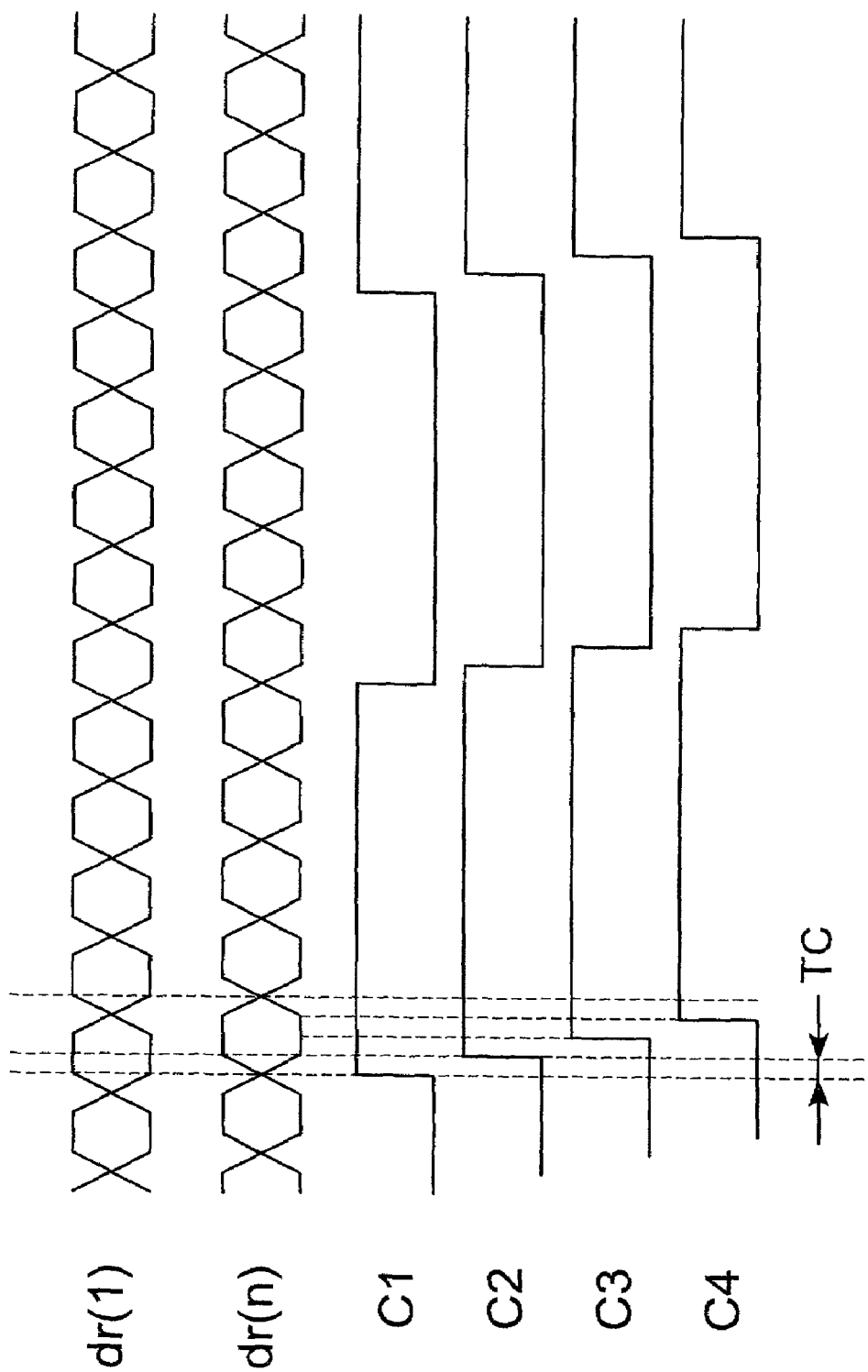
FIG. 3 is a timing diagram illustrating how oversampling may be implemented to achieve data recovery.
Figure 4:
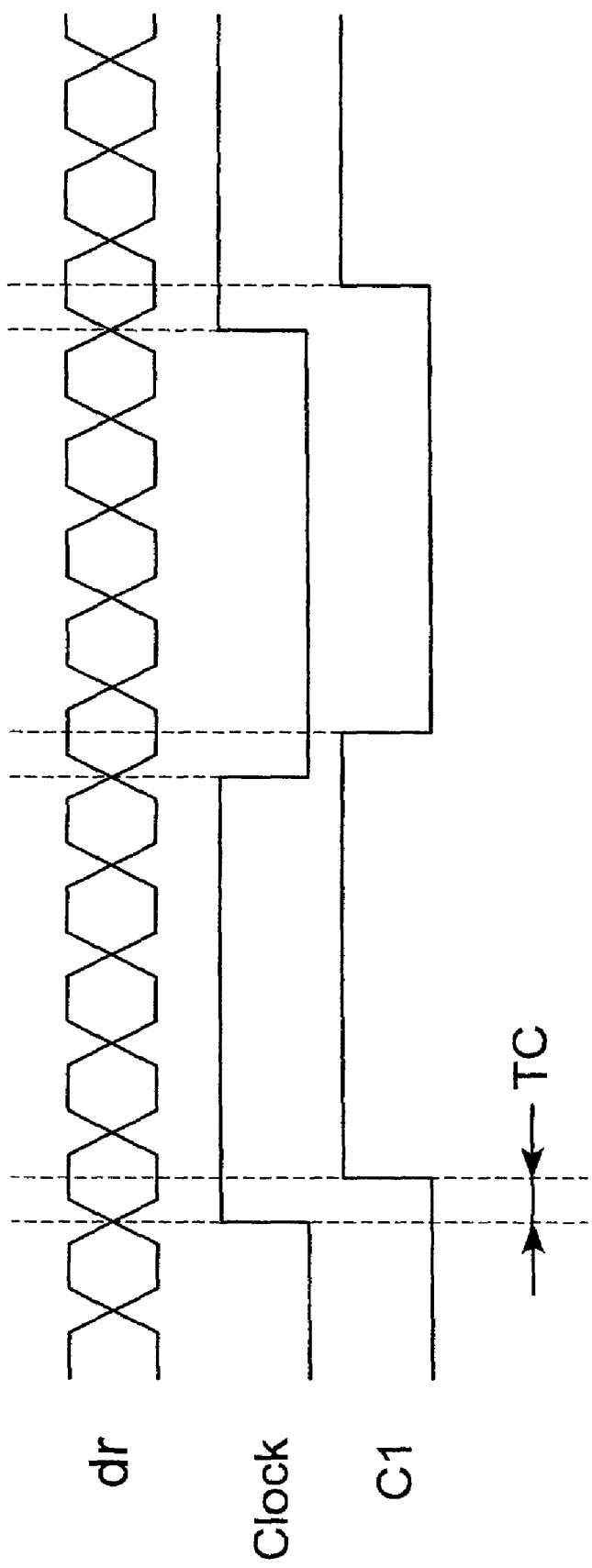
FIG. 4 is a timing diagram for a PLL in a typical PLL data recovery implementation.

Throughout the following description, the terms "synchronized" and "aligned" will be used. To facilitate a complete understanding of the description, these terms will now be defined. When a first signal is referred to as being synchronized with a second signal, it is meant that the first signal has the same period or an integral multiple of the period of the second signal. For example, if the second signal has a period of T, then the first signal is synchronized with the second signal if the first signal has a period of T, 2T, 3T, 4T, and so forth. As an example, both the Clock signal and the control signal C1 of FIG. 4 are synchronized with the data stream dr.

Just because two signals are synchronized does not mean that they are aligned, however. For a first signal to be aligned with a second signal, all of the transitions of the first signal need to coincide with transitions of the second signal. If any transition of the first signal does not coincide with a transition of the second signal, the two signals are not considered aligned. Referring again to FIG. 4 as an example, note that the Clock signal is aligned with the data stream dr because every transition of the Clock signal coincides with a transition of the data stream dr. However, the control signal C1 is not aligned with the data stream dr because its transitions fall within the data periods of the data stream dr as opposed to being coincident with the data transitions thereof. As this discussion shows, it is possible for two signals to be synchronized but not aligned with each other. With these definitions in mind, the invention will now be described.

Figure 5:
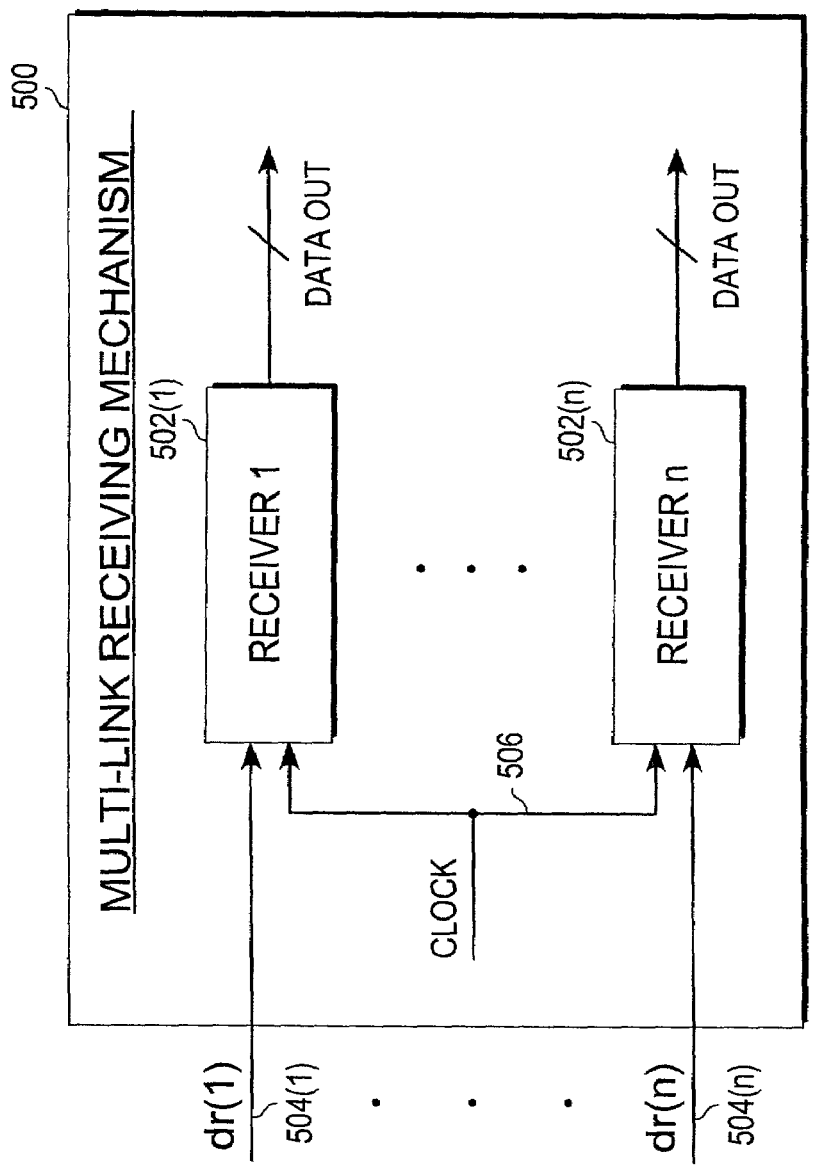
FIG. 5 is a high level block diagram of a multi-link receiving mechanism in accordance with one embodiment of the present invention.

With reference to FIG. 5, there is shown a high level block diagram of a multi-link receiving mechanism (MRM) 500 in accordance with one embodiment of the present invention. As shown in FIG. 5, the MRM 500 comprises a plurality of individual receivers 502(1)–502(n), with each receiver 502(1)–502(n) receiving a separate data stream 504(1)–504(n). In one embodiment, each of the data streams 504 comprises a plurality of serialized data units, with each data unit occupying one data period. In the following discussions, it will be assumed that the data units in the data streams 504 are individual data bits; however, it should be noted that for purposes of the present invention, the data units are not so limited but instead may be multiple bits or other types of data units (e.g. a packet). All such data units are within the scope of the present invention.

As noted previously, when multiple data streams 504 are received by a MRM, it is possible and likely that due to the inter-pair skew phenomenon, the data streams 504 will arrive at the MRM 500 out of alignment relative to each other. Thus, data streams 504(1) and 504(n) of FIG. 5, for example, may be out of alignment with each other when they arrive at the MRM 500. This does not pose a problem, however, because the MRM 500 of FIG. 5 is designed to accommodate such a situation, as will be explained further below.

In addition to a data stream 504, each receiver 502 also receives a clock signal 506. According to one embodiment, all of the receivers 502 receive the same clock signal 506. This clock signal 506 may be generated by the MRM 500, or it may be received from an external component (not shown). In one embodiment, the clock signal 506 is synchronized with each of the data streams 504, and has a period which is ten times the data period of the data units in the data streams 504. Giving the clock signal 506 such a relatively long period makes the clock signal 506 easier to manipulate. While ten data periods has been found to be a good period for the clock signal 506, it should be noted that the invention is not so limited. If so desired, the clock signal 506 may have periods of other duration. Such a modification is within the scope of the invention. A point to note is that while the clock signal 506 is synchronized with the data streams 504, it need not be aligned with any of the data streams 504. Because there is no requirement for the clock signal 506 to be aligned with any of the data streams 504, it is possible to use the same clock signal 506 for all of the receivers 502.

In response to the clock signal 506 and a data stream 504, each of the receivers 502 extracts or recovers data from its associated data stream 504. More specifically, in one embodiment, the receiver 502 delays the clock signal 506 by a variable delay to derive a reference signal (not shown). As will be described further below, this is done to achieve a desired relative alignment between the data stream 504 and the reference signal. For example, the clock signal 506 may be delayed such that it causes the reference signal to coincide approximately with the midpoint of one of the data periods of the data stream 504. Because each receiver 502 receives a separate data stream 504, and because each data stream 504 may have a different alignment, the initial alignment between the data stream 504 and the clock signal 506 may and probably will differ from receiver to receiver 502. Thus, the variable delay imposed by each receiver 502 will also most likely differ from receiver to receiver 502. According to one embodiment, each of the variable delays imposed by the various receivers 502 is greater than or equal to one data period (i.e. none of the variable delays is less than one data period). Since none of the variable delays is less than one data period, no limits are imposed on the rates at which data in the data streams 504 may be sent, as will be explained further below.

Once a receiver 502 derives a reference signal, it uses the reference signal to generate a plurality of latching control signals (not shown). In one embodiment, the receiver 502 generates one latching control signal per data period, and each latching control signal coincides approximately with the midpoint of a data period. Once the latching control signals are generated, they are used by the receiver 502 to latch all of the data units of the associated data stream 504, thereby recovering data from the data stream 504. Once recovered, the data is passed on to an external component (not shown), where it is used for its intended purpose. Each receiver 502 of the MRM 500 operates in the manner described above to recover data from each of the data streams 504. Because each receiver 502 individually processes a respective data stream 504 and adjusts for the varying alignment of the data stream 504, the MRM 500 is able to process any data stream 504, regardless of its alignment relative to the clock signal 506 or to other data streams 504. As a result, the MRM 500 is able to accommodate and properly process multiple data streams 504 with varying alignments. In short, the MRM 500 provides a solution to the inter-pair skew problem.

Moreover, the MRM 500 solves the inter-pair skew problem without incurring any of the shortcomings of the prior art. For instance, the MRM 500 does not need to implement oversampling. For each data period, no more than one latching control signal is generated (and hence, no more than one sample is taken). As a result, the redundancy associated with oversampling is eliminated. Also, each latching control signal coincides approximately with the midpoint of a data period. This means that each data unit is sampled at an optimal time during which the value of the data unit is most stable, not during other less optimal times, as was the case with oversampling.

In addition and perhaps most significantly, the MRM 500 does not impose any limits on the rates at which data may be sent on the data streams 504. As was noted above, none of the variable delays imposed by the receivers 502 is less than one data period in duration. This means that TCmin is greater than or equal to one data period. This in turn means that there is no more than one TCmin per data period. Thus, unlike the oversampling and PLL approaches, which require four and two TCmin's per data period, respectively, the MRM 500 has no more than one TCmin per data period. With one or fewer TCmin's per data period, the maximum frequency that can be achieved is determined by the data period (e.g. 1/data period), not by the number of TCmin's. Thus, in MRM 500, the maximum frequency, and hence, the maximum data rate is limited not by how fast the adjustable delays work, but by other considerations, such as how fast data can physically be sent. By not imposing a limit on how fast data can be sent, the MRM 500 maximizes the flexibility and effectiveness of the data recovery process. Overall, MRM 500 represents a significant advance over the prior art.

Figure 6:
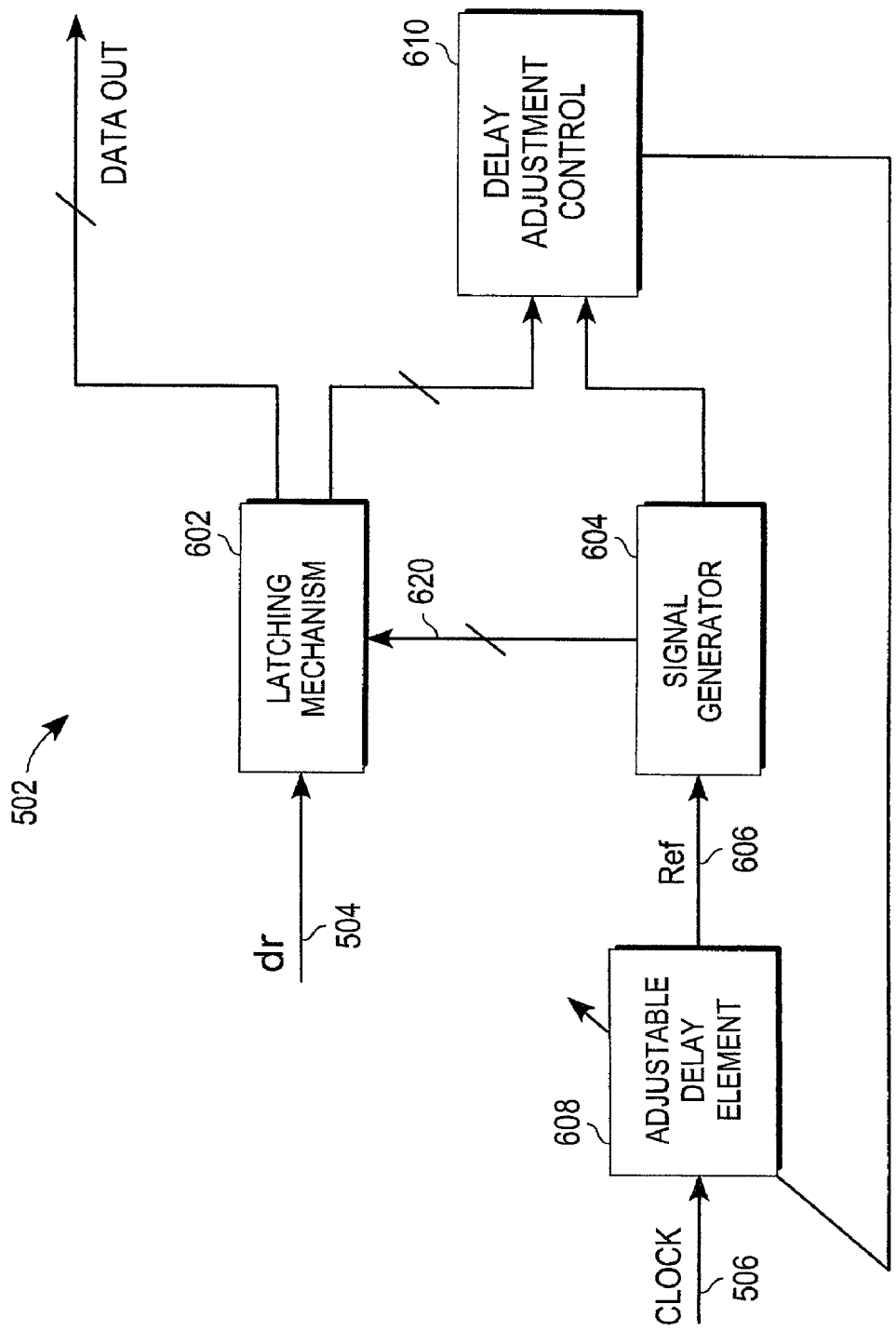
FIG. 6 is a block diagram of one of the receivers of the multi-link receiving mechanism of FIG. 5 in accordance with one embodiment of the present invention.

Thus far, an overview of the invention has been provided. With reference to the remaining figures, an illustrative embodiment will now be described in detail. According to one embodiment of the present invention, each of the receivers 502 of the MRM 500 takes the same form. An example of a form that each receiver 502 may take is shown in FIG. 6, wherein the receiver 502 comprises a latching mechanism 602, a signal generator 604, an adjustable delay element 608, and a delay adjustment control 610.

The latching mechanism 602 is the component responsible for receiving the data stream 504, and latching each of the data units in the data stream 504. In one embodiment, the latching mechanism 602 latches the data units in response to a set of latching control signals 620. More specifically, in response to each latching control signal 620, the latching mechanism 602 latches one data unit. As each data unit is latched, it is sent out onto the Data Out lines to an external component (not shown), where the data unit is processed. In one embodiment, the external component transforms the data units received from the latching mechanism 602 into parallel data. In this manner, incoming serial data is converted into parallel output data.

The latching control signals 620 used to control the operation of the latching mechanism 602 are provided by the signal generator 604. In one embodiment, the signal generator 604 generates one latching control signal per data period, and these latching control signals 620 are generated based upon the reference signal 606. If the reference signal 606 is properly aligned relative to the data stream 504, then the signal generator 604 will generate each latching control signal 620 such that the latching control signal coincides with the midpoint of a corresponding data period. As discussed previously, the optimal time to latch or sample a data unit is at the midpoint of a data period because that is where the data is most stable. Hence, it is a goal of the signal generator 604 to generate latching control signals 620 which coincide as closely as possible to the midpoints of corresponding data periods.

To enable the signal generator 604 to generate latching control signals 620 which coincide with the midpoints of corresponding data periods, the reference signal 606 is adjusted to achieve a desired alignment relative to the data stream 504. In the embodiment shown in FIG. 6, this adjustment is made by the adjustable delay element 608. More specifically, the adjustable delay element 608 receives the clock signal 506 and delays it by a variable delay to derive the reference signal 606. As noted previously, the clock signal 506 is synchronized with the data stream 504 but it is not necessarily aligned therewith. By delaying the clock signal by the proper variable delay, the adjustable delay element 608 brings the reference signal 606 into a desired alignment relative to the data stream 504. In one embodiment, this desired alignment is where the reference signal coincides with the midpoint of a data period. Put another way, it is desirable for the reference signal 606 to fall in the middle of a data period.

As the name suggests, the adjustable delay element 608 imposes an adjustable or variable delay on the clock signal 506 to derive the reference signal 606. In one embodiment, how much of a delay the element 608 imposes is controlled by the delay adjustment control 610. Basically, the delay adjustment control 610 receives input from the latching mechanism 602, and based upon this input, determines how closely the latching control signals 620 are coinciding with the midpoints of corresponding data periods. Based upon this determination, the delay adjustment control 610 adjusts the variable delay imposed by the adjustable delay element 608 to modify the relative alignment between the reference signal 606 and the data stream 504. This in turn pushes the latching control signals 620 closer to the midpoints of the corresponding data periods. Thereafter, the delay adjustment control 610 makes another determination as to how closely the latching control signals 620 are now coinciding with the midpoints of corresponding data periods. Based upon this latter determination, the delay adjustment control 610 again adjusts the variable delay imposed by the adjustable delay element 608 to adjust the relative alignment between the reference signal 606 and the data stream 504. This again results in pushing the latching control signals 620 closer to the midpoints of corresponding data periods. This feedback adjustment process continues until eventually the latching control signals 620 coincide with the midpoints of corresponding data periods. In the manner described, the receiver 502 dynamically adjusts itself to carry out effective and efficient data recovery.

Figure 7:
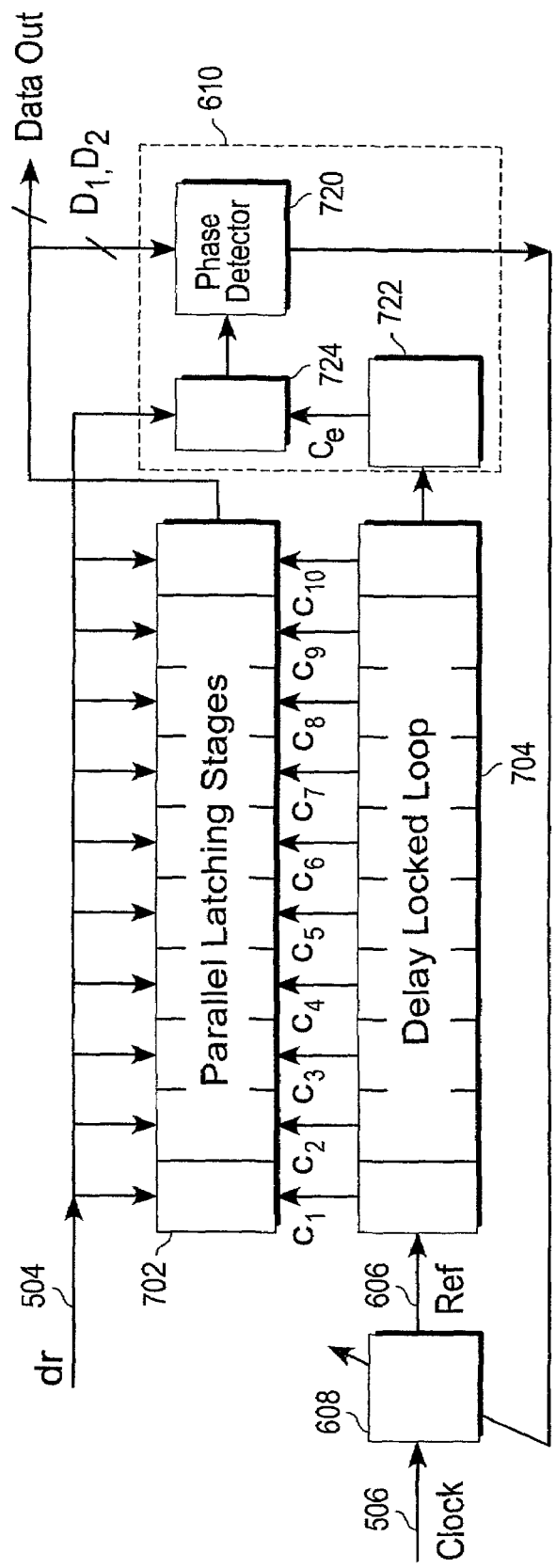
FIG. 7 shows one possible implementation of the receiver of FIG. 6.

FIG. 7 shows one possible implementation of the receiver 502 of FIG. 6. In the implementation shown in FIG. 7, the latching mechanism 602 takes the form of a multi-stage latch 702, comprising a plurality of parallel latching stages, with each latching stage coupled to receive the incoming data stream 504. Each latching stage latches a data unit from the data stream 504 in response to a corresponding latching control signal. As shown in FIG. 7, each latching stage receives its own latching control signal. For example, the first latching stage receives control signal C1, the second latching stage receives control signal C2, and so forth. During any particular data period, only one of the control signals C1–C10 is asserted; as a result, only one of the latching stages is activated to latch the data unit corresponding to that data period. Thus, although all of the latching stages are coupled to receive the data stream 504, only one of the latching stages is latching data at any one time. Over time, each of the latching stages will latch in a data unit from the data stream 504. As each data unit is latched, it is sent out onto the Data Out lines to an external component (not shown), where the data unit is processed. In one embodiment, the external component transforms the data units received from the latch 702 into parallel data. In this manner, the incoming serial data stream 504 is converted into parallel output data.

In the implementation of FIG. 7, the control signals C1–C10 which control the operation of the latch 702 are provided by a delay locked loop (DLL) 704 (the DLL acts as the signal generator 604 of FIG. 6). In one embodiment, the DLL 704 has ten stages, and each stage provides one control signal, giving a total of ten control signals C1–C10. These control signals C1–C10 are generated based upon the reference signal 606. Recall that the period of the Clock signal 506, and hence, the period of the reference signal 606 is ten data periods. Since the period of the reference signal 606 is ten data periods, and since the DLL 704 generates ten control signals C1–C10 based upon the reference signal 606, it follows that the DLL 704 generates one control signal per data period. Put another way, each of the control signals C1–C10 is separated (i.e. delayed) from a previous control signal by one data period. That is, control signal C2 is one data period delayed relative to control signal C1, control signal C3 is one data period delayed relative to C2, and so forth. By having one data period delay between each of the control signals C1–C10, it is assured that there will be no more than one control signal per data period. Hence, there is no oversampling.

As noted above, the DLL 704 generates the control signals C1–C10 based upon the reference signal 606. In one embodiment, the DLL 704 generates the control signals C1–C10 such that the first control signal C1 is delayed by one data period relative to the reference signal 606. With this being the case, and since each of the control signals C1–C10 is separated by one data period relative to a previous control signal, it follows that the control signals C1–C10 have substantially the same alignment relative to the data stream 504 as does the reference signal 606. Thus, the alignment of the reference signal 606 is significant in determining the alignments of the control signals C1–C10 relative to the data periods in the data stream 504. More specifically, if the reference signal 606 coincides with the midpoint of a data period of the data stream 504, then the control signals C1–C10 will likewise coincide with the midpoints of corresponding data periods (which is typically the desired result). As mentioned previously, the alignment of the reference signal 606 relative to the data stream 504 can be adjusted by adjusting the variable delay imposed by the adjustable delay element 608. Consequently, the adjustable delay element 608 can be used as a means for achieving optimal alignment between the control signals C1–C10 and the data periods of the data stream 504.

Figure 8:
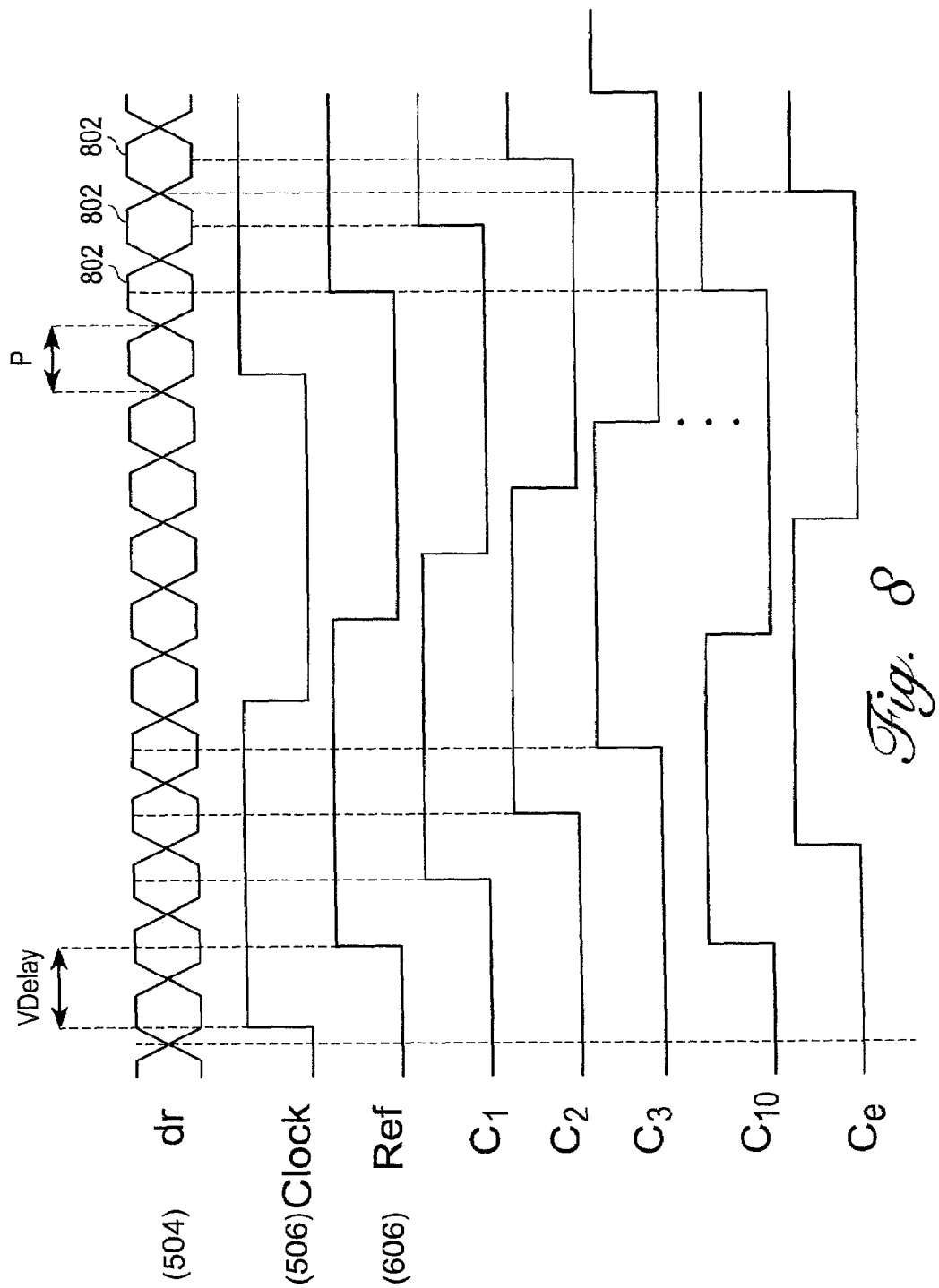
FIG. 8 is a timing diagram for the implementation of FIG. 7 illustrating relationships between various signals in steady state.

The relationships between the various signals in the receiver 502 of FIG. 7 can be seen in the timing diagram of FIG. 8. It should be noted that FIG. 8 shows the relationships once steady state has been reached. More will be said on this in a later section. As shown in FIG. 8, the data stream 504 comprises a plurality of data units 802, with each data unit 802 occupying a data period P. Each of the data units 802 is sampled and latched by the latch 702 in response to one of the control signals C1–C10. In generating the control signals C1–C10, the clock signal 506 is delayed by a variable delay Vdelay to derive the reference signal 606. Notice that the clock signal 506 need not be aligned (and is not aligned in FIG. 8) with the data stream 504. Despite this lack of alignment, because of the variability of the delay Vdelay, the reference signal 606 is still derived such that its rising edge coincides with the midpoint of a data period. As shown in FIG. 8, the variable delay Vdelay is greater than or equal to one data period.

Once the reference signal 606 is derived, it is used by the DLL 704 to generate the control signals C1–C10. Because the reference signal 606 coincides with the midpoint of a data period, the control signals C1–C10 will likewise coincide with the midpoints of corresponding data periods. As noted previously, the first control signal C1 is delayed by one data period relative to the reference signal 606, and each subsequent control signal is delayed by one data period relative to the previous control signal. Thus, as shown in FIG. 8, the rising edge of the first control signal C1 occurs one data period after the rising edge of the reference signal 606, and the rising edges of the subsequent control signals are each separated by one data period (e.g. the rising edge of signal C2 occurs one data period after the rising edge of C1, the rising edge of signal C3 occurs one data period after the rising edge of C2, and so on). Generated in this manner, each control signal C1–C10 coincides approximately with the midpoint of a corresponding data period. As this discussion shows, the receiver of FIG. 7: (1) samples the data units in the data stream 504 at the optimal times; (2) needs no more than one sample per data period; (3) can process any data stream 504 having any alignment relative to the clock signal 506; and (4) due to the fact that the variable delay Vdelay is greater than or equal to one data period, imposes no limitations on the rate at which data can be sent in the data stream 504. Because of these and other aspects, the receiver 502 represents a significant improvement over the prior art.

As noted above, FIG. 8 shows the relationships of the various signals after steady state has been reached. To get to steady state, the delay adjustment control 610 is used to adjust the variable delay imposed by the adjustable delay element 608 to push the reference signal 606 towards the midpoint of a data period. In the implementation shown in FIG. 7, the delay adjustment control 610 comprises a phase detector 720, a fixed delay element 722, and an additional latching stage 724.

The fixed delay element 722 receives the last control signal C10 as input, and provides as output a delayed version Ce of the control signal C10. In one embodiment, delay element 722 imposes a fixed delay on the control signal C10 of (X+0.5) times a data period, where X is an integer greater than or equal to 1. For the sake of illustration, it will be assumed that the integer is 1 and that element 722 imposes a fixed delay of 1.5 data periods. In accordance with this example, Ce is 1.5 data periods delayed relative to C10. Because Ce is 1.5 data periods delayed relative to the last control signal C10, and because the control signals are cyclical, Ce falls between control signals C1 and C2 in the next cycle of control signals, as shown in FIG. 8. Due to the 0.5 component of the delay, the control signal Ce at steady state will not coincide with the midpoint of a data period. Rather, it will coincide with the transition between two data periods. As will be discussed further below, this aspect of the control signal Ce is used advantageously to determine how to adjust the variable delay of the adjustable delay element 608.

The delayed control signal Ce is applied as a latching control signal to the additional latching stage 724. Since additional latching stage 724 is coupled to receive the data stream 504, the control signal Ce causes the additional latching stage 724 to latch in a data unit from the data stream 504. The data unit latched by the additional latching stage 724 is provided to the phase detector 720 for use in determining how to adjust the variable delay of the adjustable delay element 608.

In addition to receiving the data unit from the additional latching stage 724, the phase detector 720 also receives two data units D1 and D2 from the first and second latching stages, respectively, of the multi-stage latch 702. Data units D1 and D2 represent the data units sampled by the control signals C1 and C2 in the next cycle of control signals. Because control signal Ce falls between control signals C1 and C2, and because D1 and D2 represent the data units sampled by C1 and C2, D1 and D2 are the data units surrounding the data transition point approximated by Ce. By comparing the data unit sampled by Ce (i.e. the data unit provided by the additional latching stage 724) with the data units D1 and D2, the phase detector 720 determines where Ce falls relative to the data transition point, and based upon this determination, the phase detector 720 adjusts the variable delay imposed by the adjustable delay element 608 to push Ce closer to the transition point. By doing so, the phase detector 720 also pushes the reference signal 606 and the control signals C1–C10 closer to the midpoints of corresponding data periods. By continually pushing Ce closer to the data transition point, the steady state situation shown in FIG. 8 is eventually reached.

To illustrate the comparison and adjustment process carried out by the phase detector 720, reference will now be made to an example. Suppose that D1 has a bit value of "1" and D2 has a bit value of "0". Suppose further that the bit value from the additional latching stage 724 is "1". These bit values indicate that Ce is sampling the data stream 504 prior to the transition point, and hence, is latching the data unit D1 from the prior data period. In response to this situation, the phase detector 720 increases the variable delay of the adjustable delay element 608 to push Ce forward towards the transition point. On the other hand, suppose that the bit value from the additional latching stage 724 has a bit value of "0". This indicates that Ce is sampling the data stream 504 after the transition point, and hence, is latching the data unit D2 from the latter data period. To correct this situation, the phase detector 720 reduces the variable delay of the adjustable delay element 608 to push Ce backward towards the transition point. By continually adjusting the variable delay of the adjustable delay element 608 in this manner, the phase detector 720 keeps Ce as close to the transition point as possible, which in turn maintains the control signals C1–C10 as close to the midpoints of data periods as possible. Optimal data sampling is thus achieved.

Figure 9:
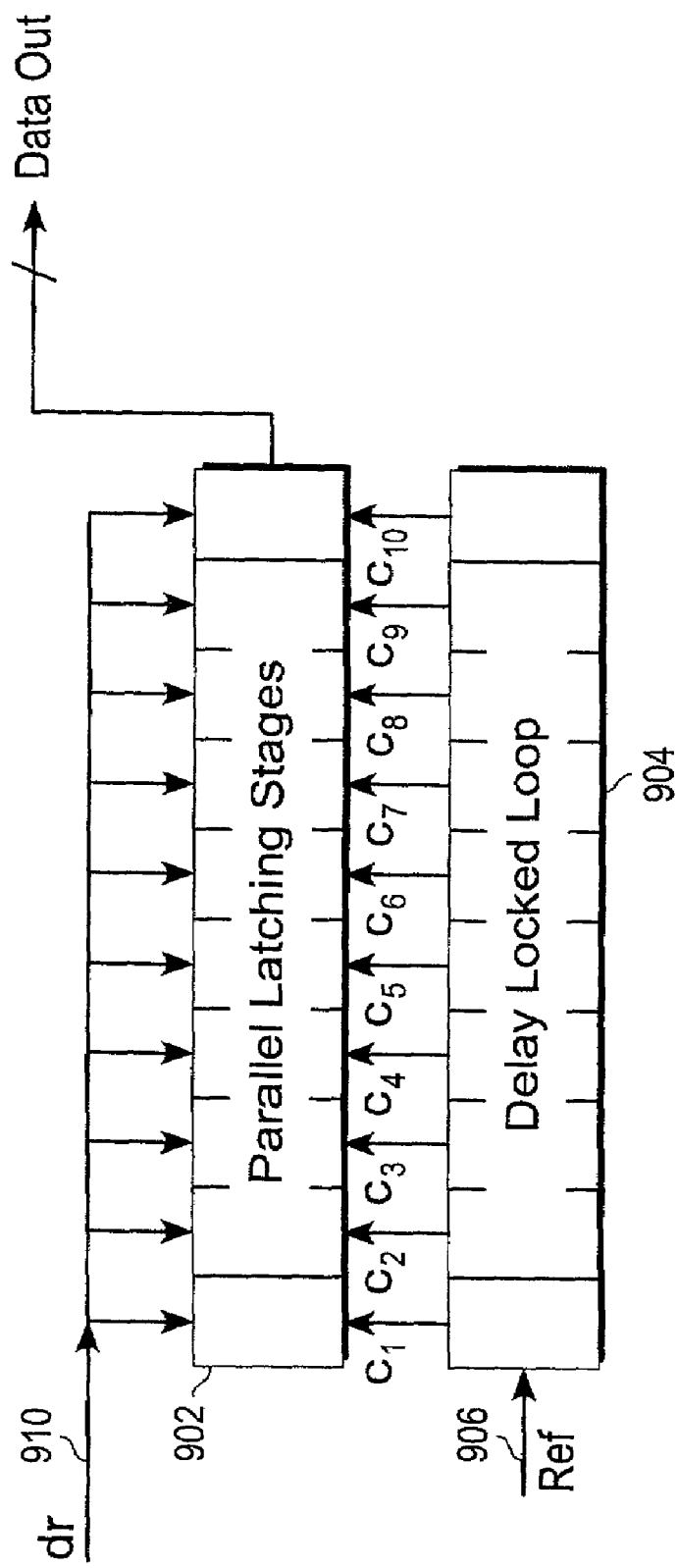
FIG. 9 shows one possible implementation for a standalone receiver in accordance with one embodiment of the present invention.

Thus far, the receiver 502 has been discussed only in the context of a multi-link receiving mechanism 500 in which multiple receivers are implemented. It should be noted though, that if so desired, a slightly modified version of the receiver 502 may be used in a single-link implementation as a standalone receiver. One embodiment of this modified version is shown in FIG. 9, comprising a multi-stage latch 902 coupled to receive a data stream 910, and a DLL 904 for generating a plurality of latching control signals C1–C10. Because this receiver 902 is used in a standalone environment and hence, does not need to account for inter-pair skew, it does not comprise an adjustable delay element or a delay adjustment control. In most other respects, though, it is substantially identical to the receiver of FIG. 7.

Like the DLL 704 of the multi-link version 502, the DLL 904 of the standalone version 902 generates the latching control signals C1–C10 based upon a reference signal 906. Like the reference signal 606 of the multi-link receiver 502, reference signal 906: (1) is synchronized with its associated data stream 910; (2) has a period which is equal to ten data periods of the data stream 910; and (3) is not edge-aligned with the data periods of the data stream 910, but rather is coincident with the midpoint of a data period of the data stream 910. Because the reference signal 906 coincides with the midpoint of a data period, the control signals C1–C10 likewise coincide with the midpoints of corresponding data periods.

For purposes of the present invention, the reference signal 906 may be provided by an external component (not shown), or generated by the receiver 902. If generated, various different methods may be used. In one embodiment, the reference signal 906 is generated as follows. First, a clock signal is generated based upon the data stream 910. This clock signal is generated such that it is synchronized and aligned with the data stream 910, and has a period equal to ten data periods of the data stream 910. Once generated, the clock signal is passed through a delay element, which imposes a selected delay on the clock signal to derive the reference signal 906. In one embodiment, the selected delay is equal to (X+0.5) times a data period, where X is an integer greater than or equal to 1. Thus, the selected delay may be 1.5, 2.5, 3.5, etc., times a data period. Because of the 0.5 component of the selected delay, the reference signal 906 is positioned such that it coincides with the midpoint of a data period of the data stream 910. With the reference signal 906 thus properly positioned, the control signals C1–C10 generated based upon the reference signal 906 will likewise coincide with the midpoints of corresponding data periods. Consequently, the receiver 902 will sample the data units of the data stream 910 at optimal times.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the appended claims.

The invention claimed is:

1. A receiver, comprising:
a latching mechanism, coupled to receive a data stream comprising a plurality of data units and to receive a plurality of latching control signals, each data unit occupying a data period, said latching mechanism latching said data units in response to said latching control signals;
a signal generator coupled to receive a reference signal, said signal generator generating said plurality of latching control signals responsive to said reference signal, where the plurality of latching control signals are offset; and
an adjustable delay element coupled to receive a clock signal and delaying said clock signal according to a phase difference between said clock signal and said data stream to derive said reference signal, said reference signal so derived causing said signal generator to generate said latching control signals such that each of said latching control signals coincides approximately with a midpoint of a data period.

2. The receiver of claim 1, wherein said clock signal is synchronized with said data stream but is not necessarily aligned therewith.

3. The receiver of claim 1, wherein said adjustable delay element delays said clock signal is greater than or equal to said data period.

4. The receiver of claim 1, wherein there is no more than one of said latching control signals per data period.

5. The receiver of claim 1, further comprising:
a delay control mechanism, said delay control mechanism adjusting said adjustable delay element to alter said reference signal, said reference signal being so altered to cause said signal generator to generate said latching control signals such that each of said latching control signals coincides more closely with a midpoint of a data period.

6. The receiver of claim 5, wherein said delay control mechanism alters said reference signal by causing said reference signal to coincide more closely with a midpoint of a data period.

7. The receiver of claim 6, wherein at least one of said latching control signals is delayed relative to said reference signal by substantially a data period.

8. The receiver of claim 7, wherein each of said latching control signals is temporally separated from another latching control signal by substantially one data period.

9. The receiver of claim 8, wherein said signal generator comprises a delay locked loop.

10. The receiver of claim 5, wherein said delay control mechanism comprises:
a detection mechanism, said detection mechanism receiving an indication of how closely each of said latching control signals coincides with a midpoint of a data period, and providing an adjustment signal to adjust said adjustable delay element to alter said reference signal to cause each of said latching control signals to coincide more closely with a midpoint of a data period.

11. The receiver of claim 10, wherein said delay control mechanism further comprises:
a fixed delay element coupled to receive at least one of said latching control signals and providing a delayed latching signal; and
a latching component coupled to receive said data stream, said latching component latching one of said data units in said data stream in response to said delayed latching signal.

12. The receiver of claim 11, wherein said detection mechanism receives said one data unit from said latching component, and compares said one data unit with a plurality of data units received from said latching mechanism to determine how closely each of said latching control signals coincides with a midpoint of a data period.

13. The receiver of claim 12, wherein said fixed delay element has a fixed delay greater than said data period.

14. The receiver of claim 13, wherein said fixed delay is approximately (X+0.5) times said data period where X is an integer greater than or equal to I.

15. The receiver of claim 12, wherein said detection mechanism comprises a phase detector.

16. A receiver comprising:
a latching mechanism, coupled to receive a data stream comprising a plurality of data units and to receive a plurality of latching control signals, each data unit occupying a data period, said latching mechanism latching said data units in response to said latching control signals;
a signal generator including a delay locked loop coupled to receive a reference signal, said delay locked loop generating said plurality of latching control signals responsive to said reference signal, where the latching control signals are offset by substantially one data period; and an adjustable delay element coupled to receive a clock signal and delaying said clock signal according to a phase difference between said clock signal and said data stream to derive said reference signal, said reference signal so derived causing said delay locked loop to generate said latching control signals such that each of said latching control signals coincides approximately with a midpoint of a data period.

17. The receiver of claim 16, wherein there is no more than one of said latching control signals for each of said data periods.

18. The receiver of claim 16, wherein said reference signal coincides approximately with a midpoint of a data period.

19. The receiver of claim 5, wherein at least one of said latching control signals is delayed relative to said reference signal by substantially one data period.

20. The receiver of claim 19, wherein each of said latching control signals is temporally separated from another latching control signal by substantially one data period.

21. A receiver, comprising:

a latching mechanism, coupled to receive a data stream comprising a plurality of data units and to receive a plurality of latching control signals, each data unit occupying a data period, said latching mechanism latching said data units in response to said latching control signals; and a signal generator coupled to receive a reference signal which is not aligned with said data stream, said signal generator generating said latching control signals based upon said reference signal such that each of said latching control signals coincides approximately with a midpoint of a data period, where the latching control signals are offset by substantially one data period.

22. The receiver of claim 21, wherein there is no more than one of said latching control signals for each of said data periods.

23. The receiver of claim 21, wherein said reference signal coincides approximately with a midpoint of a data period.

24. The receiver of claim 23, wherein said reference signal is derived by delaying a clock signal, which is synchronized and aligned with said data stream, by a delay which is approximately equal to (X+0.5) times said data period where X is an integer greater than or equal to 1.

25. The receiver of claim 23, wherein at least one of said latching control signals is delayed relative to said reference signal by substantially one data period.

26. The receiver of claim 25, wherein each of said latching control signals is temporally separated from another latching control signal by substantially one data period.

27. The receiver of claim 26, wherein said signal generator comprises a delay locked loop.

28. A receiver comprising:

a latching mechanism, coupled to receive a data stream comprising a plurality of data units and to receive a plurality of latching control signals, each data unit occupying a data period, said latching mechanism latching said data units in response to said latching control signals; and a delay locked loop coupled to receive a reference signal, said delay locked loop generating said latching control signals responsive to said reference signal such that each of said latching control signals coincides approximately with a midpoint of a data period, where the reference signal is a variably delayed signal and where each of the latching control signals are offset by substantially one data period.

29. The receiver of claim 28, wherein there is no more than one of said latching control signals per data period.

30. The receiver of claim 28, wherein said reference signal is not aligned with said data stream.

31. The receiver of claim 30, wherein said reference signal coincides approximately with a midpoint of a data period.

32. The receiver of claim 31, wherein said reference signal is derived by delaying a clock signal, which is synchronized and aligned with said data stream, by a delay which is approximately equal to (X+0.5) times said data period where X is an integer greater than or equal to 1.

33. The receiver of claim 31, wherein at least one of said latching control signals is delayed relative to said reference signal by substantially one data period.

34. The receiver of claim 33, wherein each of said latching control signals is temporally separated from another latching control signal by substantially one data period.

* * * * *